US009235665B2

(12) United States Patent
Stelmakh

(10) Patent No.: US 9,235,665 B2
(45) Date of Patent: Jan. 12, 2016

(54) SYSTEM, METHOD AND APPARATUS FOR HANDLING POWER LIMIT RESTRICTIONS IN FLASH MEMORY DEVICES

(71) Applicant: SanDisk Technologies Inc., Plano, TX (US)

(72) Inventor: Konstantin Stelmakh, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 34 days.

(21) Appl. No.: 13/829,426

(22) Filed: Mar. 14, 2013

(65) Prior Publication Data

US 2014/0100838 A1 Apr. 10, 2014

Related U.S. Application Data

(60) Provisional application No. 61/712,247, filed on Oct. 10, 2012.

(51) Int. Cl.
*G06F 17/50* (2006.01)
*G06F 1/32* (2006.01)

(52) U.S. Cl.
CPC .......... *G06F 17/5022* (2013.01); *G06F 1/3206* (2013.01); *G06F 1/3275* (2013.01); *Y02B 60/1214* (2013.01); *Y02B 60/1228* (2013.01)

(58) Field of Classification Search
None
See application file for complete search history.

(56) References Cited

U.S. PATENT DOCUMENTS

| 7,969,809 | B2 * | 6/2011 | Ben-Rubi | 365/226 |
| 8,402,296 | B2 | 3/2013 | Brundridge et al. | |
| 2007/0049134 | A1 * | 3/2007 | Conroy et al. | 439/894 |
| 2008/0307240 | A1 * | 12/2008 | Dahan et al. | 713/320 |
| 2010/0174928 | A1 * | 7/2010 | Borghetti et al. | 713/320 |
| 2012/0216058 | A1 * | 8/2012 | Wells et al. | 713/322 |

OTHER PUBLICATIONS

Jun Yang; Xiuyi Zhou; Chrobak, M.; Youtao Zhang; Lingling Jin, "Dynamic Thermal Management through Task Scheduling," Performance Analysis of Systems and software, 2008. ISPASS 2008. IEEE International Symposium on , vol., no., pp. 191,201, Apr. 20-22, 2008.*
Wikipedia, Throttling process (computing). May 2, 2012. Retrieved Dec. 12, 2014, from http://en.wikipedia.org/wiki/Throttling_process_%28computing%29.*

(Continued)

*Primary Examiner* — Omar Fernandez Rivas
*Assistant Examiner* — Bijan Mapar
(74) *Attorney, Agent, or Firm* — Martine Penilla Group, LLP

(57) ABSTRACT

A system, method and apparatus for dynamic power management including creating a model for each task of multiple tasks performed by a circuit, the model including a corresponding power requirement value for each task, selecting each task for execution, executing the selected task when the corresponding power requirement value does not exceed an average power consumption cap of an execution window, determining an actual power consumption of the selected task during execution of the selected task and storing the actual power consumption corresponding to the selected task as the corresponding power requirement value for the selected task. A memory system can include a memory die, a data bus coupled to the memory die, a power supply coupled to the memory die, a power monitor coupled to the memory die and the power supply and a controller coupled to the data bus and the memory die.

19 Claims, 5 Drawing Sheets

(56) References Cited

OTHER PUBLICATIONS

Merkel, Andreas, and Frank Bellosa. "Balancing power consumption in multiprocessor systems." ACM SIGOPS Operating Systems Review 40.4 (2006): 403-414.*

Bansal, Nikhil, et al. "Power monitors: A framework for system-level power estimation using heterogeneous power models." VLSI Design, 2005. 18th International Conference on. IEEE, 2005.*

Yang, Jun, et al. "Dynamic thermal management through task scheduling." Performance Analysis of Systems and software, 2008. ISPASS 2008. IEEE International Symposium on. IEEE, 2008.*

* cited by examiner

SYSTEM, METHOD AND APPARATUS FOR HANDLING POWER LIMIT RESTRICTIONS IN FLASH MEMORY DEVICES

This application claims priority from U.S. Provisional Patent Application No. 61/712,247 filed on Oct. 10, 2012 and entitled "System, Method and Apparatus for Handling Power Limit Restrictions in Flash Memory Devices," which is incorporated herein by reference in its entirety for all purposes.

BACKGROUND

The present invention relates generally to circuit power management schemes, and more particularly, to methods, systems and apparatus for managing power consumption in memory circuits.

Prior art circuit power management schemes for flash memory circuits model a power consumption of each flash task that the flash memory circuit may be expected to execute. The power consumption model of each flash task is defined by a worst-case value observed in worst case environmental context (e.g., temperature, data pattern, user scenario, circuit component aging, etc.) of each of those tasks on a selected number of samples.

As each flash task appears in the pipeline, the flash tasks are delayed or executed based upon the worst-case scenario modeled power consumption such that an average power cap in a sliding execution window (e.g., a 16 millisecond sliding execution window) is not exceeded. All currently running tasks are summed to evaluate an average consumption, typically, the actual power consumption values are significantly lower than worst case power consumption values that are used for average calculation.

The prior art power consumption model of each flash task is static, meaning that once the model is defined, sometime during the manufacturing process, the model remains the same throughout the life of the memory device. Unfortunately many different dynamic execution conditions can occur that can change the actual power consumption of a given task. By way of example, an operating temperature, an age, a task execution order, a task execution rate demand, etc., can cause the actual power consumption being greater or lower than the static model that was created when the device was manufactured.

As a result, the prior art power consumption model of each flash task always forces the performance of each flash task to be artificially degraded to account for worst-case scenario, even when the worst-case scenario does not occur. Thus the performance of the memory device is often degraded excessively and unnecessarily. Further, the static, prior art power consumption model that was created when the device is manufactured cannot and does not account for possible dynamic changes and thus may not even limit the power consumption to less than the power cap. Further still, the static, prior art power consumption model is an open loop type system because there is no feedback.

In view of the foregoing, there is a need for a dynamic power consumption model of each task that accurately and dynamically reflects the actual execution conditions so as to more efficiently operate the memory circuit.

SUMMARY

Broadly speaking, the present invention fills these needs by providing a system, method and apparatus for a dynamic power and closed loop consumption model of each task in a memory circuit. It should be appreciated that the present invention can be implemented in numerous ways, including as a process, an apparatus, a system, computer readable media, or a device. Several inventive embodiments of the present invention are described below.

One embodiment provides a method for dynamic power management including creating a model for each task of multiple tasks performed by a circuit, the model including a corresponding power requirement value for each task, selecting each task for execution, executing the selected task when the corresponding power requirement value does not exceed an average power consumption cap of an execution window, determining an actual power consumption of the selected task during execution of the selected task and storing the actual power consumption corresponding to the selected task as the corresponding power requirement value for the selected task.

Creating the model for each task can include storing the model of each of the tasks in a reference table. Creating the model for each task can also include selecting one of the tasks, determining an estimated maximum power requirement of the selected task, assigning a task identifier corresponding to the selected task and storing the task identifier and the estimated maximum power requirement corresponding to the selected task in a reference table, the corresponding estimated maximum power requirement value being stored in the corresponding power requirement value in the reference table. The estimated maximum power requirement can include a worst case execution power requirement. The estimated maximum power requirement can include an average execution power requirement derived from test data.

The execution window can include a selected duration. The total average power consumption cap of the execution window includes a sum of the average power consumed by each one of the tasks executed within the execution window. Storing the actual power consumption corresponding to the selected task in the corresponding power requirement value includes storing the actual average power consumption corresponding to the selected task in the corresponding power requirement value for a selected number of iterations of the selected task.

Determining the actual power consumption of the selected task during execution of the selected task can include determining the actual power consumption due to at least one of an actual workload, an actual age, an actual temperature of the circuit performing the task.

During runtime, total power consumption of a device can be monitored (e.g., internally by controller) by a continuous average power calculation over running window (last X ms), summing the contributions of all tasks in the selected execution window, e.g. over last 16 ms all tasks contribution is summed [AVG×task duration], summed with other tasks and divided by 16 ms.

The method can also include delaying execution of the selected task when the corresponding power requirement field value exceeds the average power consumption cap minus total power consumed by the device in the execution window. At least one of the tasks can be a memory task, a controller task, a combination of memory task and controller tasks. The execution window is a sliding execution window.

Another embodiment provides a memory system including a memory die, a data bus coupled to the memory die, a power supply coupled to the memory die, a power monitor coupled to the memory die and the power supply, a controller coupled to the data bus and the memory die and a dynamic power consumption model for each one of multiple tasks stored in a computer readable medium and being accessible by the controller, the controller including logic embodied in a computer readable medium to monitor the execution of each task and logic embodied in a computer readable medium to update an actual power consumed by the executed task in the dynamic corresponding power consumption model.

The controller can be included on the memory die. The controller can also include logic embodied in a computer readable medium for creating a model for each task performed by the memory system, the model including a corresponding power requirement value for each task, logic embodied in a computer readable medium for selecting each task for execution and logic embodied in a computer readable medium for executing the selected task when the corresponding power requirement value does not exceed an average power consumption cap of an execution window.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for systems, methods and apparatus for dynamic power consumption model of each task in a memory circuit will now be described. It will be apparent to those skilled in the art that the present invention may be practiced without some or all of the specific details set forth herein.

A system, method and apparatus for a dynamic power consumption model of each task in a memory circuit includes a closed loop capable of providing periodic and even near real time feedback to dynamically update the power consumption model. The power requirements value of each task is initially estimated and stored in a corresponding power requirements field such as in a reference table. Every power cycle (power ON) or every hour or some other selected time interval and/or selected execution cycle count, the actual power consumption for each task is measured as the circuit is performing that task. Then the power requirements value is updated with the actual power consumption for each task to create a dynamic model. The dynamic model values can also be used to update the initially estimated values that may be used in production of subsequently produced memory systems. The dynamic model improves on the performance of the circuit by not artificially degrading performance all of the time and also prevents the power cap being exceeded due to situations that typical static power consumption models did not account for. As a result, performance of the circuit is improved over the typical static power consumption models and the power cap is not exceeded even in situations not foreseen by the typical static power consumption models.

The dynamic power consumption model can also manage power requirements for tasks other than memory tasks by also applying the dynamic modeling technique to controller tasks in addition to only memory tasks that were accounted for in the typical static power consumption model.

Figure 1:
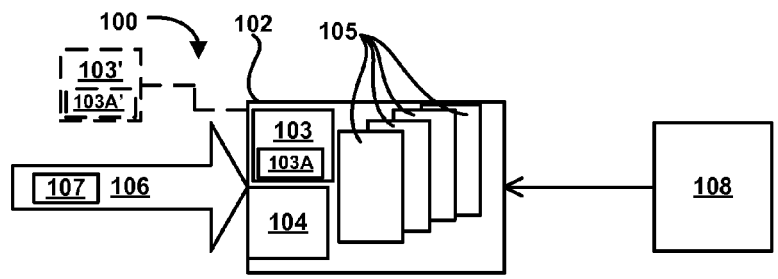
FIG. 1 is a schematic diagram of a memory system, in accordance with embodiments of the present invention.

FIG. 1 is a schematic diagram of a memory system 100, in accordance with embodiments of the present invention. The memory system 100 includes a memory die 102, coupled to a power supply 108, and a data bus 106. The memory die 102 can include a controller circuit 103 and one or more memory circuits 105. Alternatively, the controller circuit 103' can be external from the memory die 102. The controller circuit 103 can also include logic and/or software 103A (103A' on the alternate, externally located controller 103') on a computer readable medium that controls the operation of the memory system 100. The memory die 102 can also include a reference table 104. Reference table 104 can include a power consumption model for the execution of each of the tasks to be executed in the memory system 100 as will be described in more detail below.

Figure 2:
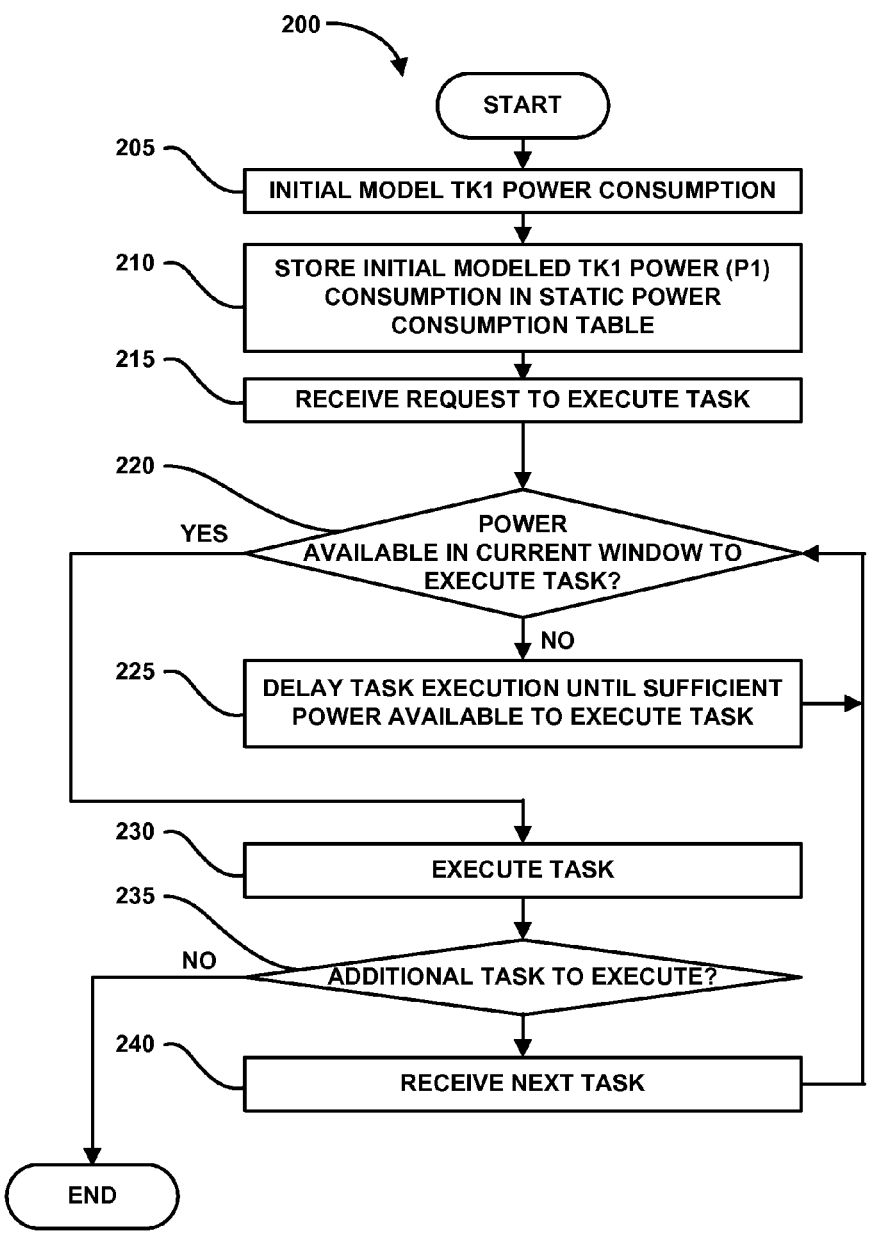
FIG. 2 is a flowchart diagram that illustrates the method operations performed to create a static power consumption model for a memory system, in accordance with embodiments of the present invention.

FIG. 2 is a flowchart diagram that illustrates the method operations 200 performed to create a static power consumption model for the typical memory system 100, in accordance with embodiments of the present invention. The operations illustrated herein are by way of example, as it should be understood that some operations may have sub-operations and in other instances, certain operations described herein may not be included in the illustrated operations. With this in mind, the method and operations 200 will now be described.

The method operations 200 include an operation 205. In operation 205, an initial, static power consumption model for each task is created. The initial, static power consumption model for each task calculates the maximum power consumption under a worst-case operational scenario for that task or some other default scenario for calculating the power consumption for each task. By way of example, other scenarios for calculating the initial static, power consumption model for each task can include, a manually selected power consumption for each task or a known or an average power consumption or any other suitable scenario. The tasks being modeled can include tasks for the memory circuits 105 including, but not limited to, Sense, Erase, Program and other memory circuit tasks. The tasks being modeled can also include tasks for the controller 103 including, but not limited to, transfer, encode, decode and other controller tasks. The tasks being modeled can also include tasks for the controller 103 and the memory circuits 105 including, but not limited to, idle, Xfer Data and other tasks. Table 1 shows several tasks and their corresponding power requirements.

TABLE 1

| Task | Owner | Temperature | | |
|---|---|---|---|---|
| | | Cold | Moderate | Hot |
| Idle | Total | 5 mA | 5 mA | 6 mA |
| Encode | Controller | 70 mA | 73 mA | 90 mA |
| Decode | Controller | 45 mA | 46 mA | 50 mA |
| Sense SLC | Memory Ckt | 35 mA | 35 mA | 45 mA |
| Sense MLC | Memory Ckt | 50 mA | 53 mA | 45 mA |
| Erase SLC | Memory Ckt | 75 mA | 75 mA | 75 mA |
| PROG MLC $1^{st}$ Step | Memory Ckt | 45 mA | 45 mA | 47 mA |
| XFR 4 kB Data Leg. | Total | 20 mA | 25 mA | 25 mA |
| XFR Data TM | Total | 40 mA | 40 mA | 40 mA |

It should be noted that the tasks listed in Table 1 are merely a selection of possible tasks and their corresponding power requirements and are not a comprehensive list of tasks. Further, the power required for the task is merely exemplary for an example memory system. By way of example, an Idle task may be a basic standby task that causes the memory operations to pause for the duration of the Idle task. The Encode/Decode tasks are data manipulation tasks where data is encoded or decoded as needed. The Sense SLC and Sense MLC are read tasks to retrieve data stored in the memory circuit. The Erase SLC is a memory circuit task to erase data stored at a specific memory location. The PROG MLC $1^{st}$ Step writes data to a specific memory location. The XFR 4 kB Data Leg and XFR Data™ are data transfer tasks transferring data between the memory and the controller or externally from the memory system.

Calculating the maximum power consumption under a worst-case operational scenario includes such variables as the extreme operating temperature, the most frequent cycling, worst-case aging of the circuitry, and any other types of worst-case operational parameters that will increase the power consumption as the circuit performs the task.

The corresponding initial, static power consumption model for each task is stored in the reference table 104 in an operation 210. The reference table 104 can be included inside the memory die 102 or inside the controller circuit 103 or in a common die with the controller circuit 103' separate from and linked to the memory die 102. The initial, static power consumption model for each task can be stored in the reference table 104 as part of the production of the memory system such as in the factory or as part of the installation of the memory system 100.

In an operation 215, the controller circuit 103 receives a request 107 to perform a task. The request 107 is delivered to the controller 103 on the data bus 106. In operation 220, the controller 103 determines if there is sufficient power available in the current execution window to accommodate the static power consumption model corresponding to the received task. If there is enough power available (budget>task requirement) task is executed.

Figure 3:
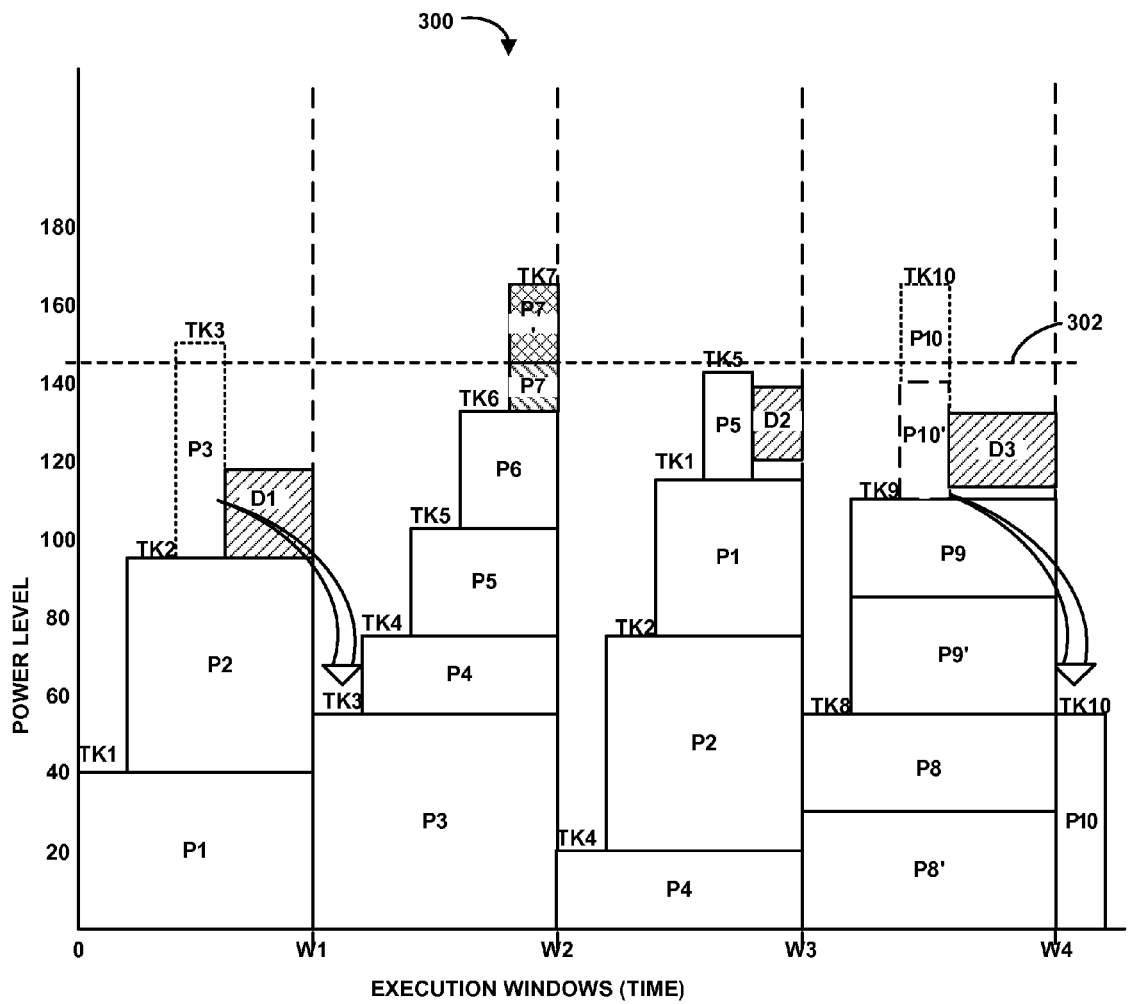
FIG. 3 is a graphical representation of execution of several tasks using a static power consumption model, in accordance with embodiments of the present invention.

FIG. 3 is a graphical representation 300 of execution of several tasks using a static power consumption model, in accordance with embodiments of the present invention. Power levels are shown along the vertical axis and time is shown along the horizontal axis. The time is shown in terms of execution windows. It should be understood that the execution window can be in different forms. The execution window can be a defined time interval (e.g. 16 msec or longer or shorter than 16 msec). The execution window can be a sliding execution window that is constantly sliding forward in time. The execution windows are shown as discrete, separate, sequential windows to simplify the discussion. An average power cap 302 is also shown for discussion purposes. The average power cap 302 is the average power consumption allowed in an execution window. The exemplary power cap 302 has a level of 145 mA. This indicates that in each execution window, e.g., W1, multiple tasks are allowed to be executed until cumulative static power consumption model of each task would exceed the power cap 302.

By way of example, during execution window W1 of FIG. 3, a first task TK1 is received. TK1 has a static power consumption model of P1 (40 mA). Referring again to operation 220 in FIG. 2, the execution of TK1 is modeled to consume 40 mA and since the power cap 302 is 145 mA and no power had yet been consumed in execution window W1, then there is 105 mA remaining in the power cap if TK1 is allowed to execute. Thus the method operations continue in operation 230 where TK1 is executed.

If no additional tasks are to be executed as determined in an operation 235, then the method operations can end. If additional tasks (e.g., TK2) are to be executed as determined in operation 235, then the method operations continue in an operation 240. In an operation 245, the controller 103 receives a subsequent request 107 to perform a task e.g., TK2 and the method operations continue in operation 220.

Referring again to execution window W1 of FIG. 3, the second task TK2 is received. TK2 has a static power consumption model of P2 (55 mA). Referring again to operation 220 in FIG. 2, the execution of TK2 is modeled to consume 55 mA and since the power cap 302 is 145 mA and only TK1 has been executed and the corresponding static modeled power P1 of 40 mA has been consumed then the cumulative static modeled power of TK1 and TK2 would be only 95 mA, thus leaving 50 mA remaining in execution window W1. Thus the method operations continue in operation 230 where TK2 is executed.

If additional tasks (e.g., TK3) are to be executed as determined in operation 235, then the method operations continue in an operation 240. In an operation 245, the controller 103 receives a subsequent request 107 to perform a task e.g., TK3 and the method operations continue in operation 220.

Referring again to execution window W1 of FIG. 3, the third task TK3 is received. TK3 has a static power consumption model of P3 (55 mA). Referring again to operation 220 in FIG. 2, the execution of TK3 is modeled to consume 55 mA and since the power cap 302 is 145 mA, and TK1 and TK2 are currently being executed and the corresponding static modeled power P1 of 40 mA and P2 of 55 mA has been consumed then the cumulative static modeled power of TK1 and TK2 would be 95 mA, thus leaving only 50 mA remaining in execution window W1. However, TK3 is modeled to consume P3 of 55 mA and thus there is not sufficient power available in the current execution window to execute TK3 and method operations continue in an operation 225.

In operation 225, execution of task TK3 is delayed for a delay period D1 until sufficient power is available to execute TK3. By way of example, TK3 may be delayed to the next execution window, e.g., W2 and the method operation continue in operation 220 as described above. It should be understood that where the execution window W1 is a sliding window, after a delay that may be less than D1, when sufficient power (e.g., 5 mA in the present example) becomes available, such as when execution of TK1 is completed, then the delayed task TK3 can immediately be executed. By way of example, if the execution window has a duration of 16 msec in the above example, and TK1 required 10 msec to complete execution, then 10 msec after execution of TK1 is initiated, 40 mA would become available and since TK3 was delayed until 5 mA are available, then TK3 can be executed as soon as the execution of TK1 is completed.

One of the problems with the static power consumption model is illustrated in execution window W2 of FIG. 3. Each of tasks TK3-TK6 execute as described above. TK3 has a static power consumption model of 55 mA. TK4 has a static power consumption model of 20 mA. TK5 has a static power consumption model of 25 mA. TK6 has a static power consumption model of 30 mA.

TK7 has a static power consumption model of 15 mA. However, TK7's actual power consumption of 40 mA, greatly exceeds the static model of 15 mA. TK7's actual power consumption is greater than the static power consumption model of 15 mA due to circuit aging or sequence of operations or some other dynamic reasons and combinations thereof, which were not accounted for in TK7's initial, static power consumption model.

Thus, referring again to FIG. 2 above and beginning at operation 220, TK7 would be allowed to execute in operation 230 because there was sufficient power available in the execution window W2 for the TK7's initial, static power consumption model of 15 mA. However, since TK7's actual power consumption is greater than the static power consumption model of 15 mA, then the power cap 302 is exceeded by allowing TK7 to execute. This is a flaw in the static power consumption model.

Another of the problems with the static power consumption model is illustrated in execution window W4 of FIG. 3. Each of tasks TK8 and TK9 are executed as described above. TK8 has an initial, static power consumption model of 55 mA. TK9 has an initial, static power consumption model of 55 mA. TK10 has an initial, static power consumption model of 55 mA. As a result, TK10 is delayed a delay interval of D3. However, the actual power consumption of TK8 and TK9 are only 40 mA actually leaving 65 mA available before exceeding the power cap 302. Thus, TK10 is unnecessarily delayed because the 65 mA available is more than sufficient to allow even TK10's static power consumption model of 55 mA. Further, if TK10's actual power consumption was also 40 mA then a subsequent task could be executed in W4, in addition to TK10, thus further delaying execution of tasks in the pipeline of tasks to be executed.

Figure 4:
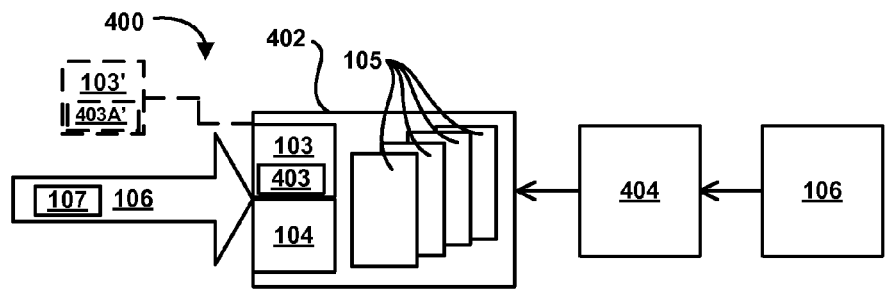
FIG. 4 is a schematic diagram of a memory system with a dynamic power consumption model in accordance with embodiments of the present invention.

FIG. 4 is a schematic diagram of a memory system 400 including a dynamic power consumption model in accordance with embodiments of the present invention. The memory system 400 is substantially similar to the memory system 100 except for the addition of logic 403 and a power monitor 404.

The power monitor 404 monitors the actual power consumed by each task as it is executed. The power monitor can be any suitable type such as a resistive power monitor or a magnetic sensing power monitor or any other suitable power monitoring device or circuit.

The controller 103 can also include logic and/or software 403 on a computer readable medium that controls the operation of the memory system 400. The logic and/or software 403, updates the dynamic power consumption model for each executed task with the actual power consumption value and stores the resulting dynamic power consumption model in the reference table 104.

Figure 5:
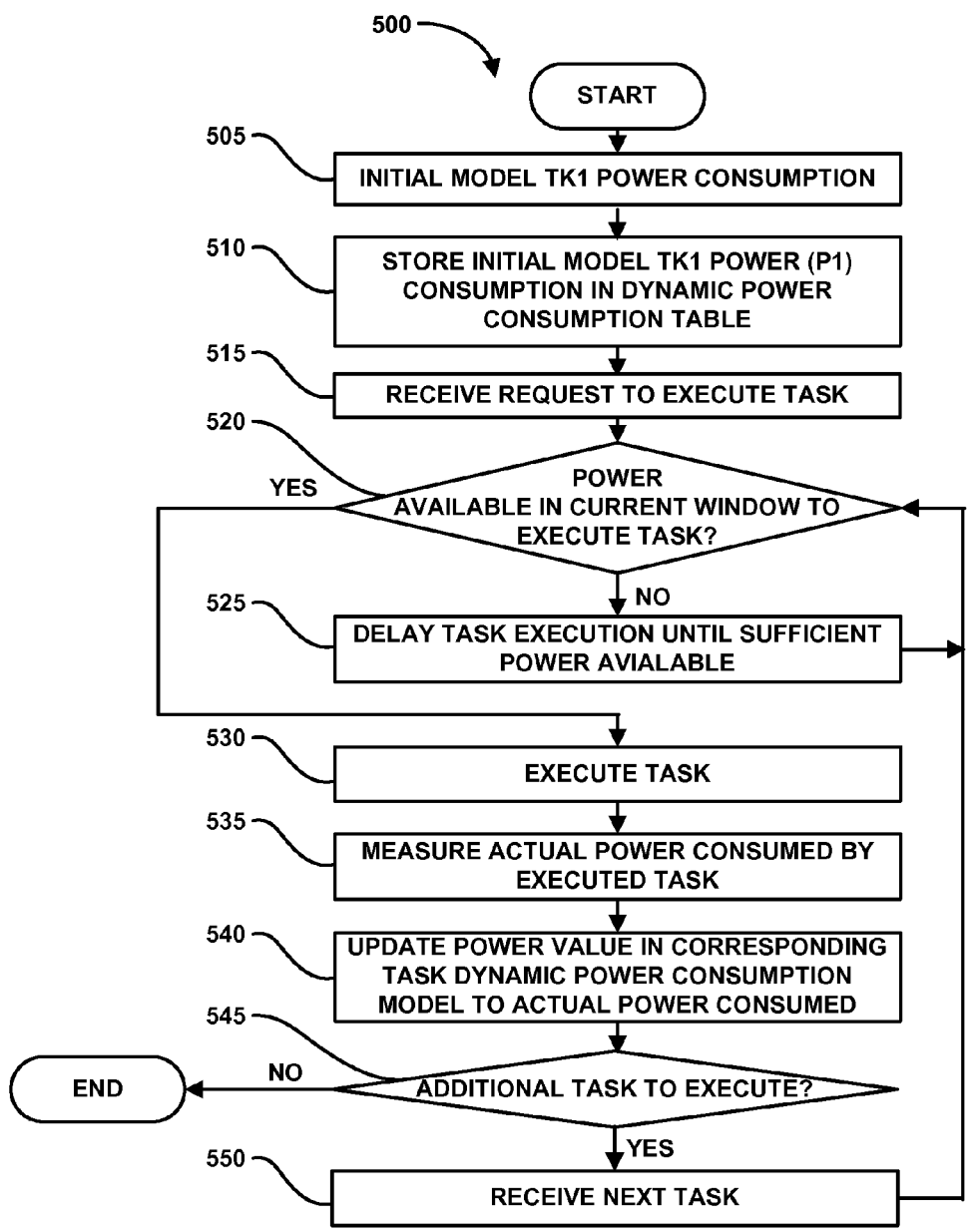
FIG. 5 is a flowchart diagram that illustrates the method operations performed to create a dynamic power consumption model for a memory system in accordance with embodiments of the present invention.

FIG. 5 is a flowchart diagram that illustrates the method operations performed to create a dynamic power consumption model for a memory system in accordance with embodiments of the present invention. The operations illustrated herein are by way of example, as it should be understood that some operations may have sub-operations and in other instances, certain operations described herein may not be included in the illustrated operations. With this in mind, the method and operations 500 will now be described.

In an operation 505, an initial, power consumption model for each task is created. The initial power consumption model is calculated as described above in FIG. 2.

The corresponding initial, static power consumption model for each task is stored in the reference table 104 in an operation 510. The reference table 104 can be included inside the memory die 102 or inside the controller 103 or in a common die with the alternative controller 103' separate from and linked to the memory die 102.

In an operation 515, the controller 103 receives a request 107 to perform a task. The request 107 is delivered to the controller 103 on the data bus 106. In an operation 520, the controller 103 determines if there is sufficient power available in the current execution window to accommodate the dynamic power consumption model corresponding to the received task. Determining if there is sufficient power available to execute the task includes comparing the dynamic power consumption model of the task to the power available in the current execution window.

Figure 6:
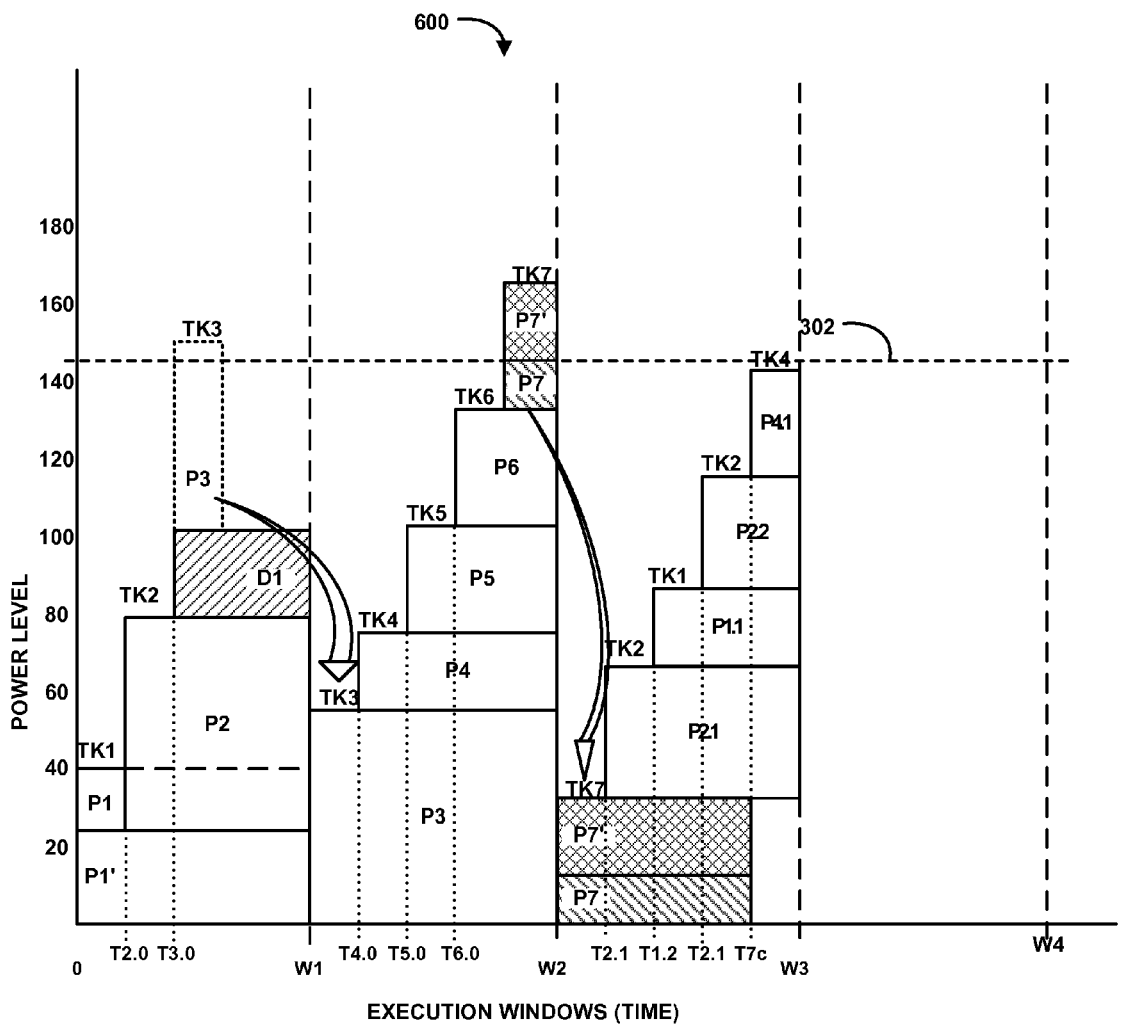
FIG. 6 is a graphical representation of execution of several tasks using a dynamic power consumption model in accordance with embodiments of the present invention.

FIG. 6 is a graphical representation 600 of execution of several tasks using a dynamic power consumption mode, in accordance with embodiments of the present invention. Power levels are shown along the vertical axis and time is shown along the horizontal axis. The time is shown in terms of execution windows. It should be understood that the execution window can be in different forms. The execution window can be a defined time interval (e.g. 16 msec or longer or shorter than 16 msec). The execution window can be a sliding execution window that is constantly sliding forward in time. The execution windows are shown as discrete, separate, sequential windows to simplify the discussion.

An average power cap 302 is also shown for discussion purposes. The average power cap 302 is the average power consumption allowed in an execution window. The exemplary power cap 302 has a level of 145 mA. This indicates that in each execution window, e.g., W1, multiple tasks are allowed to be executed until cumulative static power consumption model of each task would exceed the power cap 302.

By way of example, during execution window W1 of FIG. 6, a first task TK1 is received. TK1 has an initial dynamic power consumption model of P1 (40 mA). Referring again to operation 520 in FIG. 5, the execution of TK1 is initially modeled to consume 40 mA and since the power cap 302 is 145 mA and no power had yet been consumed in execution window W1, then there is 105 mA remaining in the power cap if TK1 is allowed to execute. Thus the method operations continue in operation 530 where TK1 is executed.

During the execution of TK1 in operation 530, the actual power consumed by the executed task is measured by the power monitor 404, in an operation 535. In an operation 540, the actual power consumed by the executed task is updated in the corresponding dynamic power consumption model stored in the reference table 104 and the method operations continue in an operation 545. By way of example, if the actual power consumed by TK1 is 25 mA, then 25 mA value is stored in the dynamic power consumption model of TK1 to replace the initial value of 40 mA. If the actual power consumed by TK1 is 50 mA, then 50 mA value is stored in the dynamic power consumption model of TK1 to replace the initial value of 40 mA.

Updating the dynamic power consumption model with the actual power consumption values improves the accuracy of the dynamic power consumption model and thus more efficiently allocates the available power under the cap 302. The dynamic power consumption model also avoids unintentionally exceeding the power cap and unnecessarily delaying execution of the tasks as will be described in more detail below.

If no additional tasks are to be executed as determined in operation 545, then the method operations can end. If additional tasks (e.g., TK2) are to be executed as determined in operation 545, then the method operations continue in an operation 550. In an operation 550, the controller 103 receives a subsequent request 107 to perform a task e.g., TK2 and the method operations continue in operation 520 as described above.

Referring again to execution window W1 of FIG. 6, the second task TK2 is received. TK2 has an initial power consumption model of P2 (55 mA). Referring again to operation 520 in FIG. 5, the execution of TK2 is initially modeled to consume 55 mA and since the power cap 302 is 145 mA and only TK1 has been executed and the actual power consumed by TK1 was only 25 mA, then, unlike the static power consumption model above, only the actual 25 mA portion of the cap 302 is allocated to TK1, leaving 120 mA available under the cap 302 for executing TK2. Further, since the cumulative modeled power of TK1 and TK2 would be only 80 mA, thus leaving 65 mA remaining in execution window W1. Thus the method operations continue in operation 530 where TK2 is executed.

During the execution of TK2 in operation 530, the actual power consumed by the executed task TK2 is measured by the power monitor 404, in an operation 535. In an operation 540, the actual power consumed by the currently executed task is updated in the corresponding dynamic power consumption model stored in the reference table 104 and the method operations continue in an operation 545. By way of example, if the actual power consumed by TK2 is 35 mA, then 35 mA value is stored in the dynamic power consumption model of TK2 to replace the initial value of 55 mA. If the actual power consumed by TK2 is 75 mA, then 75 mA value is stored in the dynamic power consumption model of TK2 to replace the initial value of 55 mA.

If no additional tasks are to be executed as determined in operation 545, then the method operations can end. If additional tasks (e.g., TK3) are to be executed as determined in operation 545, then the method operations continue in an operation 550. In an operation 550, the controller 103 receives a subsequent request 107 to perform a task e.g., TK3 and the method operations continue in operation 520 as described above.

Referring again to execution window W1 of FIG. 6, the third task TK3 is received. TK3 has an initial power consumption model of P3 (90 mA). Referring again to operation 520 in FIG. 5, the execution of TK3 is modeled to consume 90 mA and since the power cap 302 is 145 mA and only TK1 and TK2 have been executed and the actual power consumed by TK1 and TK2 was only 25 mA+35 mA, then, unlike the static power consumption model above, only the actual 60 mA portion of the cap 302 is allocated to TK1 and TK2, leaving 85 mA available under the cap 302 for executing TK3. The cumulative power consumption of TK1, TK2 and TK3 would be 150 mA, thus there is insufficient power available under the cap 302 to execute TK3 in the current execution window W1. Thus the method operations continue in operation 525 where TK3 is delayed until sufficient power is available to execute TK3 and the method operations continue in operation 520.

During the execution of TK3 in operation 530, the actual power consumed by the executed task TK3 is measured by the power monitor 404, in an operation 535. In an operation 540, the actual power consumed by the currently executed task is updated in the corresponding dynamic power consumption model stored in the reference table 104 and the method operations continue in an operation 545. By way of example, if the actual power consumed by TK3 is 50 mA, then 50 mA value is stored in the dynamic power consumption model of TK3 to replace the initial value of 90 mA. If the actual power consumed by TK3 is 100 mA, then 100 mA value is stored in the dynamic power consumption model of TK3 to replace the initial value of 90 mA.

Tasks TK4-TK6 are executed as set forth above in operations 520-540. When TK7 is evaluated for execution in operation 520, TK7's actual power consumption of P7+P7' would be used to determine if there was sufficient power available to execute TK7 and since the initial power consumption value P7 has been updated to an actual power consumption value of P1+P1', then TK7 would be delayed until sufficient power is available to execute TK7 instead of allowed to execute as would occur in a static model system 100 described in FIGS. 1-3 above.

Referring to execution window W3, each time a task is executed the actual power consumption can be updated. As shown TK2 actual power consumption value P2.1 has been updated from a previous execution of TK2. TK1 actual power consumption value P1.1 and P1.2 have been updated from each previous execution of TK1. TK4 actual power consumption value P4.1 has been updated from a previous execution of TK4. It should be noted that the tasks being executed are not limited to only tasks for memory circuits 105 but also include tasks for the controller 103 and the entire memory die 402 such as exemplary tasks described in Table 1 above and similar tasks that are not listed in Table 1.

The corresponding actual power consumption value is dynamically updated in the dynamic power consumption model, thus providing the controller with a more accurate estimation of the power consumption of the task being evaluated for execution in operation 520 than in the static power consumption model. Thus, unnecessary task execution delays are avoided. Further, increases in power consumption that were unforeseen in the static power consumption model are accounted for in the dynamic power consumption model thus allowing the controller to prevent inadvertently exceeding the power cap 302.

It should be understood that for discussion purposes only, the execution windows described in FIGS. 3 and 6 are relatively fixed because the tasks executed within the execution windows require the entire window duration to complete execution. However, if, for example, and with reference to FIG. 6, TK7 completed execution at time T7c, then immediately the power consumed by TK7 (35 mA) would become available for use below the power cap. As TK4 is being requested at time T7c, then the 35 mA allotted to TK7 and the about 30 mA remaining between the cap 302 and the power allotted to TK2, TK1 and the second TK1. Thus 65 mA is available under the cap 302 to determine if there is sufficient power available to execute TK4 at time T7c.

It should also be understood that the operation 540, updating the actual power consumption of an executed task, as described above, may occur every time the task is executed or every preselected number of executions of the task or after a preselected time interval (e.g., hourly, daily, weekly, monthly, etc.) as may be desired by the user/operator of the memory system 400. It should also be understood that the periodic updating the actual power consumption of an executed task can occur during normal memory operations or separately during a dedicated calibration or maintenance cycle as may be programmed within the logic 403 in the controller 103.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations. An exemplary structure for the invention is described below.

Figure 7:
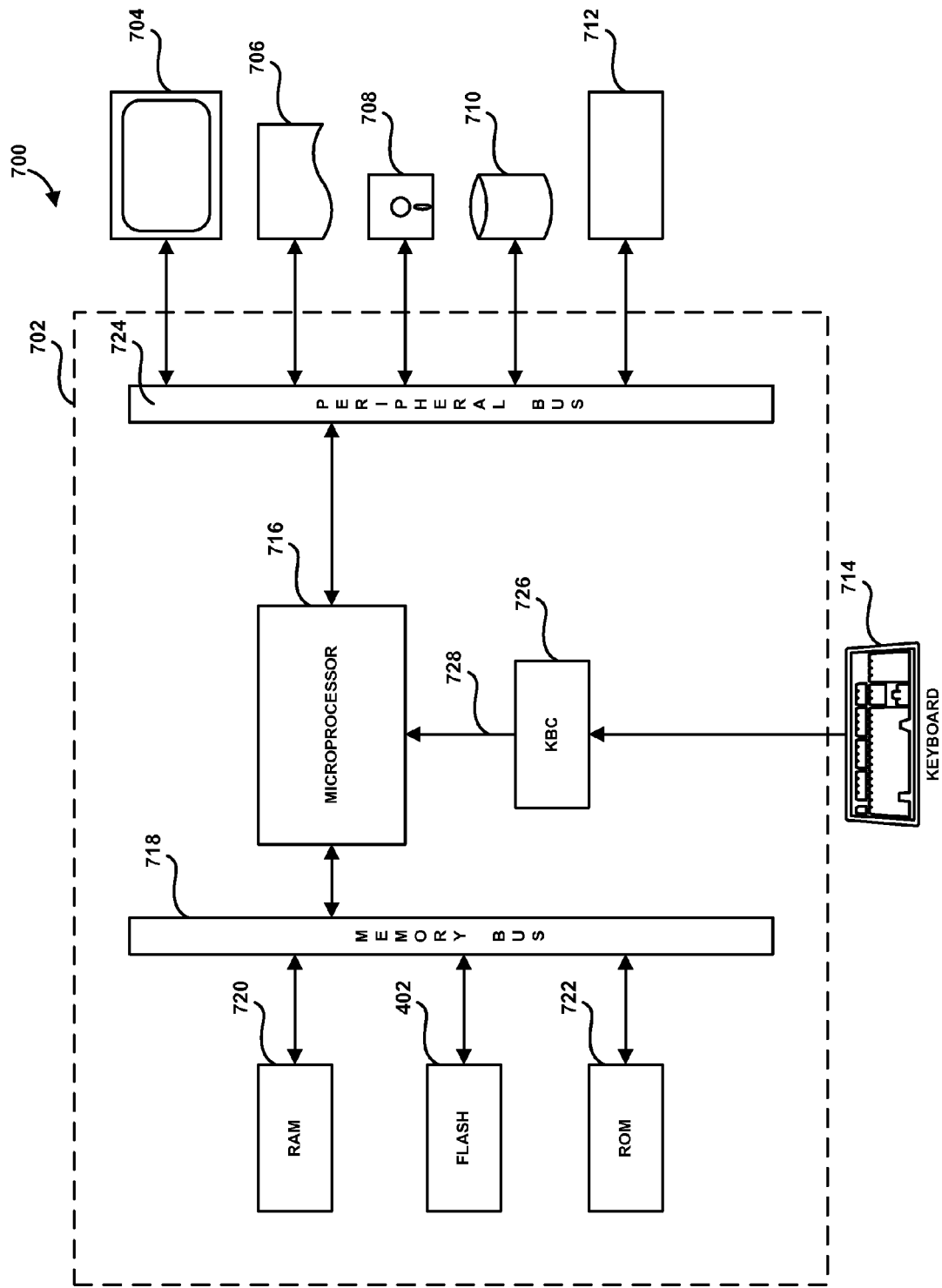
FIG. 7 is a schematic diagram of an exemplary computer system including a memory system with a dynamic power consumption model in accordance with embodiments of the present invention.

FIG. 7 is a schematic diagram of an exemplary computer system 700 including a memory system with a dynamic power consumption model in accordance with embodiments of the present invention. The computer system 700 includes a digital computer 702, a display screen (or monitor) 704, a printer 706, a floppy disk/optical/flash drive 708, a hard disk drive 710, a network interface 712, and a keyboard 714. The digital computer 702 includes a microprocessor 716, a memory bus 718, random access memory (RAM) 720, read only memory (ROM) 722, a peripheral bus 724, and a keyboard controller (KBC) 726. The digital computer 702 can be a personal computer (such as an IBM compatible personal computer, a Macintosh computer or Macintosh compatible computer), a workstation computer (such as a Sun Microsystems or Hewlett-Packard workstation), or some other type of computer.

The microprocessor 716 is a general purpose digital processor, which controls the operation of the computer system 700. The microprocessor 716 can be a single-chip processor or can be implemented with multiple components. Using instructions retrieved from memory, the microprocessor 716 controls the reception and manipulation of input data and the output and display of data on output devices.

The memory bus 718 is used by the microprocessor 716 to access the RAM 720, the ROM 722 and the memory system 400. The RAM 720 is used by the microprocessor 716 as a general storage area and as scratch-pad memory, and can also be used to store input data and processed data. The ROM 722 can be used to store instructions or program code followed by the microprocessor 716 as well as other data. The memory system 400 can be used to augment the RAM 720 and the ROM 722 and the microprocessor 716 can use the memory system 400 similar to the RAM 720 and the ROM 722. The memory system 400 may also replace one or both of the RAM 720 and the ROM 722.

The peripheral bus 724 is used to access the input, output, and storage devices used by the digital computer 702. In the described embodiment, these devices include the display screen 704, the printer device 706, the floppy disk/optical/flash drive 708, the hard disk drive 710, and the network interface 712. The keyboard controller 726 is used to receive input from keyboard 714 and send decoded symbols for each pressed key to microprocessor 716 over bus 728.

The display screen 704 is an output device that displays images of data provided by the microprocessor 716 via the peripheral bus 724 or provided by other components in the computer system 700. The printer device 706, when operating as a printer, provides an image on a sheet of paper or a similar surface. Other output devices such as a plotter, typesetter, etc. can be used in place of, or in addition to, the printer device 706.

The floppy disk/optical/flash drive 708 and the hard disk drive 710 can be used to store various types of data. The floppy disk/optical/flash drive 708 facilitates transporting such data to other computer systems, and hard disk drive 710 permits fast access to large amounts of stored data. The flash drive 708 can include the memory system 400.

The microprocessor 716 together with an operating system operate to execute computer code and produce and use data. The computer code and data may reside on the RAM 720, the ROM 722, the memory system 400, or the hard disk drive 710. The computer code and data could also reside on a removable program medium and loaded or installed onto the computer system 700 when needed. Removable program media include, for example, CD-ROM, PC-CARD, floppy disk, flash memory, optical media and magnetic tape.

The network interface 712 is used to send and receive data over a network connected to other computer systems. An interface card or similar device and appropriate software implemented by the microprocessor 716 can be used to connect the computer system 700 to an existing network and transfer data according to standard protocols.

The keyboard 714 is used by a user to input commands and other instructions to the computer system 700. Other types of user input devices can also be used in conjunction with the present invention. For example, pointing devices such as a computer mouse, a track ball, a stylus, or a tablet can be used to manipulate a pointer on a screen of a general-purpose computer.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network. With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A method for dynamic power management comprising:
creating a model for each task of a plurality of tasks performed by a circuit, the model including a corresponding power requirement value for each task of the plurality of tasks, wherein the power requirement value for each task is equal to a corresponding average power consumed during a duration of the respective task;
executing a selected task of the plurality of tasks when a sum of the corresponding power requirement value of the selected task and a corresponding power requirement value of all other simultaneously executed tasks of the plurality of tasks does not exceed an average power consumption cap of a sliding execution window, wherein the selected task has a duration less than the sliding execution window;
determining an actual power consumption of the selected task during execution of the selected task;
storing the actual power consumption corresponding to the selected task as the corresponding power requirement value for the selected task after the execution of the selected task is completed;
incrementing the sliding execution window forward an increment equal to the selected task's duration of execution when the execution of the selected task is completed; and
repeating the steps of executing, determining, storing and incrementing for each task of the plurality of tasks.

2. The method of claim 1, wherein creating the model for each task of the plurality of tasks includes storing the model of each of the plurality of tasks in a reference table.

3. The method of claim 2, wherein creating the model for each task of the plurality of tasks includes:
selecting one of the tasks of the plurality of tasks;
determining an estimated maximum power requirement of the selected task is equal to a corresponding average power consumed during the duration of the respective task;
assigning a task identifier corresponding to the selected task; and
storing the task identifier and the estimated maximum power requirement corresponding to the selected task in a reference table, the corresponding estimated maximum power requirement value being stored as the corresponding power requirement value in the reference table.

4. The method of claim 3, wherein the estimated maximum power requirement includes a worst case execution power requirement for the selected task.

5. The method of claim 1, wherein the sliding execution window includes a selected duration.

6. The method of claim 1, wherein the selected task is one a plurality of tasks and a first one of the plurality of tasks has a first duration and a second one of the plurality of tasks has a second duration, wherein the first duration is not equal to the second duration.

7. The method of claim 1, wherein storing the actual power consumption corresponding to the selected task in the corresponding power requirement value includes storing the actual power consumption corresponding to the selected task in the corresponding power requirement value for every iteration of a plurality of iterations of the selected task.

8. The method of claim 1, wherein determining the actual power consumption of the selected task during execution of the selected task includes determining the actual power consumption due to at least one of an actual workload, an actual age, an actual temperature of the circuit performing the task.

9. The method of claim 1, further comprising delaying execution of the selected task when the sum of the corresponding power requirement value of the selected task and the corresponding power requirement value of all other simultaneously executed tasks of the plurality of tasks exceeds the average power consumption cap of the sliding execution window.

10. The method of claim 9, wherein delaying execution of the selected task includes executing the selected task in a subsequent sliding execution window.

11. The method of claim 1, wherein at least one of the plurality of tasks is a controller task.

12. The method of claim 1, wherein at least one of the plurality of tasks is a memory task consisting of:
a sense memory circuit task;
an erase memory circuit task; or
a program memory circuit task.

13. The method of claim 1, wherein the selected task is one a plurality of tasks and an execution of a first one of the plurality of tasks overlaps an execution of a second one of the plurality of tasks.

14. A memory system comprising:
a memory die;
a data bus coupled to the memory die;
a power supply coupled to the memory die;
a power monitor coupled to the memory die and the power supply;
a controller coupled to the data bus and the memory die; and
a dynamic power consumption model for each one of a plurality of tasks stored in a non-transitory computer readable medium and being accessible by the controller, the dynamic power consumption model for each one of the plurality of tasks includes a power requirement value for each task is equal to a corresponding average power consumed during a duration of the respective task;
the controller including logic embodied in a non-transitory computer readable medium to monitor the execution of each task and logic embodied in a non-transitory computer readable medium to update an actual power consumed by the executed task as the corresponding power requirement value after the execution of the selected task is completed;
wherein the controller further includes:
logic embodied in a non-transitory computer readable medium for executing a selected task of the plurality of tasks when a sum of the corresponding power requirement value of the selected task and a corresponding power requirement value of all other simultaneously executed tasks of the plurality of tasks does not exceed an average power consumption cap of a sliding execution window, wherein the selected task has a duration less than the sliding execution window;

logic embodied in a non-transitory computer readable medium for determining an actual power consumption of the selected task during execution of the selected task;

logic embodied in a non-transitory computer readable medium for storing the actual power consumption corresponding to the selected task as the corresponding power requirement value for the selected task after the execution of the selected task is completed;

logic embodied in a non-transitory computer readable medium for incrementing the sliding execution window forward an increment equal to the selected task's duration of execution when the execution of the selected task is completed; and logic embodied in a non-transitory computer readable medium for repeating the steps of executing, determining, storing and incrementing for each task of the plurality of tasks.

15. The memory system of claim 14, wherein the controller is included on the memory die.

16. The system of claim 14, wherein at least one of the plurality of tasks is a flash memory task.

17. The system of claim 14, wherein at least one of the plurality of tasks is a controller task.

18. The system of claim 14, wherein the plurality of tasks includes at least one a flash memory task and at least one controller task.

19. A method for dynamic power management of a memory circuit comprising:

identifying a corresponding power requirement value for each task of a plurality of tasks performed by the memory circuit;

executing a selected task of the plurality of tasks when a sum of the corresponding power requirement value of the selected task and a corresponding power requirement value of all other simultaneously executed tasks of the plurality of tasks does not exceed an average power consumption cap of a present sliding execution window, wherein the selected task has a duration less than the present sliding execution window, wherein executing the selected task does not include reducing a voltage or a frequency of the operation of the memory circuit;

determining an actual power consumption of the selected task during execution of the selected task; and updating the corresponding power requirement value for the selected task by storing the actual power consumption corresponding to the selected task as the corresponding power requirement value of the selected task, after the selected execution of the selected task is completed;

incrementing the sliding execution window forward an increment equal to the selected task's duration of execution when the execution of the selected task is completed; and repeating the steps of executing, determining, storing and incrementing for each task of the plurality of tasks.

* * * * *